US006239003B1

(12) United States Patent
Rao et al.

(10) Patent No.: US 6,239,003 B1
(45) Date of Patent: May 29, 2001

(54) METHOD OF SIMULTANEOUS FABRICATION OF ISOLATION AND GATE REGIONS IN A SEMICONDUCTOR DEVICE

(75) Inventors: Kalipatnam V. Rao, Richmond, VA (US); Richard L. Guldi, Dallas; Kueing-Long Chen, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/334,786

(22) Filed: Jun. 16, 1999

(Under 37 CFR 1.47)

Related U.S. Application Data

(60) Provisional application No. 60/089,629, filed on Jun. 16, 1998.

(51) Int. Cl.[7] .................................................. H01L 21/76
(52) U.S. Cl. ......................... 438/439; 438/225; 438/297; 438/362; 438/410
(58) Field of Search .................................... 438/439, 225, 438/297, 362, 410

(56) References Cited

U.S. PATENT DOCUMENTS

| | | | |
|---|---|---|---|
| 4,541,167 | | 9/1985 | Havemann et al. ................. 29/576 |
| 5,665,620 | * | 9/1997 | Nguyen et al. ...................... 438/593 |
| 5,710,454 | * | 1/1998 | Wu ....................................... 257/413 |
| 5,814,551 | * | 9/1998 | Park et al. ........................... 438/439 |
| 5,837,378 | * | 11/1998 | Mathews et al. ................... 438/439 |
| 5,874,325 | * | 2/1999 | Koike .................................. 438/439 |
| 5,902,125 | * | 5/1999 | Wu ....................................... 438/300 |
| 6,066,545 | * | 5/2000 | Doshi et al. ........................ 438/439 |
| 6,087,241 | * | 7/2000 | St. Armand et al. .............. 438/439 |
| 6,090,686 | * | 7/2000 | Brady et al. ........................ 438/439 |
| 6,096,613 | * | 1/2000 | Wu ....................................... 438/439 |

FOREIGN PATENT DOCUMENTS

288199A * 10/1996 (TW) ........................... H01L/27/105

OTHER PUBLICATIONS

V. M. H. Meyssen, et al., *Framed Poly Buffer Locus Technology for 0.35 μm CMOS*, pp. 257–260.
Avid Kanger, et al., *An Integrated Isolation/Gate Process for Sub–Quarter Micron Technologies*, AT&T Bell Laboratories, 11–3, pp. 141–142.

* cited by examiner

*Primary Examiner*—Charles Bowers
*Assistant Examiner*—David S. Blum
(74) *Attorney, Agent, or Firm*—Jacqueline J. Garner; W. James Brady, III; Frederick J. Telecky, Jr.

(57) ABSTRACT

A method of forming a semiconductor device includes forming a moat stack outwardly from a substrate, the moat stack comprising a dielectric pad disposed outwardly from the substrate, a silicon buffer structure disposed outwardly from the dielectric pad, and a protective dielectric cap disposed outwardly from the silicon buffer structure. The method further comprises forming a protective sidewall structure outwardly from at least a sidewall of the silicon buffer structure, forming an isolation dielectric region adjacent to the moat stack, after formation of the isolation dielectric region, removing the protective dielectric cap, and forming a conductive gate comprising the silicon buffer structure.

14 Claims, 2 Drawing Sheets

METHOD OF SIMULTANEOUS FABRICATION OF ISOLATION AND GATE REGIONS IN A SEMICONDUCTOR DEVICE

This application claims priority under 35 USC §119(e)(1) of provisional application number 60/082,629 filed Jun. 16, 1998.

TECHNICAL FIELD OF THE INVENTION

This invention relates generally to the field of electronic devices and more particularly to a semiconductor device having simultaneously fabricated isolation and gate regions and a method for fabricating the same.

BACKGROUND OF THE INVENTION

Local oxidation of silicon (LOCOS) has become a popular method of fabricating semiconductor devices. LOCOS typically involves forming isolating dielectric regions between active regions of devices, to electrically isolate each device sharing a common substrate. These isolating dielectric regions are typically formed by thermally growing oxide between stacks of nitride on silicon oxide disposed over areas that will become active regions of the substrate. Using conventional LOCOS techniques, the thermally grown isolating oxide generally tends to encroach into the active regions of the substrate, limiting the packing density of semiconductor devices in the resulting structure.

One approach to reducing the encroachment of the isolation dielectric into the active regions of the substrate is to form a thick nitride shield over a pad oxide, which is disposed on the substrate. A problem with this approach, however, is that the presence of the thick nitride shield stresses the silicon in the active region during formation of the isolation dielectric which creates stress related imperfections, such as dislocations, in the silicon. An additional problem with this approach is that the resulting structure exhibits a non-planar surface, which makes focusing lithography equipment difficult.

Another approach to protecting the substrate from these stresses is commonly referred to as poly-buffered LOCOS (PBL). This approach involves forming a disposable polysilicon buffer layer between the pad oxide and the nitride shield to absorb stresses from the nitride on the substrate. Although the polysilicon buffer layer acts to absorb some stress, this approach still suffers from difficulties in lithography created by the resultant nonplanar surfaces. Still another approach, referred to as sidewall-sealed poly-buffered LOCOS (SSPBL) is similar to PBL, with the added features of etching a trench into the silicon and implementing sidewall protective structures in an effort to limit encroachment of the isolation oxide and maintain a planar surface. Each of these approaches has a disadvantage of using a disposable polysilicon buffer structure, which must later be replaced with another silicon structure to form a gate, resulting in additional fabrication time and expense.

SUMMARY OF THE INVENTION

In accordance with the teachings of the present invention, a method of forming a semiconductor device is provided that substantially eliminates or reduces the disadvantages associated with prior techniques and processes.

In accordance with one embodiment of the present invention, a method of forming a semiconductor device comprises forming a moat stack outwardly from a substrate, the moat stack comprising a dielectric pad disposed outwardly from the substrate, a silicon buffer structure disposed outwardly from the dielectric pad, and a protective dielectric cap disposed outwardly from the silicon buffer structure. The method further comprises forming a protective sidewall structure outwardly from at least a sidewall of the silicon buffer structure, forming an isolation dielectric region adjacent to the moat stack, after formation of the isolation dielectric region removing the protective dielectric cap, and forming a conductive gate comprising the silicon buffer structure.

Technical advantages of the present invention include the provision of a method of fabricating a semiconductor device in which a silicon buffer structure used to shield an active region of the substrate from stress during fabrication can be reused as a conductive gate in a variety of semiconductor devices. The invention saves time and expense in the fabrication process by eliminating the need to remove and discard the silicon buffer structure only to replace it with another silicon gate structure.

In addition, through the use of substantially amorphous silicon in the silicon buffer structure, the invention more effectively reduces stress on the silicon of the active regions of the substrate during formation of isolation dielectric regions. Using amorphous silicon in silicon buffer structure further provides an advantage of being resistant to stresses during fabrication, resulting in an effective and reliable gate. Undercutting the silicon buffer structure helps to relieve stress on the active region of the substrate, by eliminating a source of stress transmission from the protective dielectric cap. The undercut regions of the silicon buffer structure also provide an effective anchor for the protective sidewall structures used during the fabrication process.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
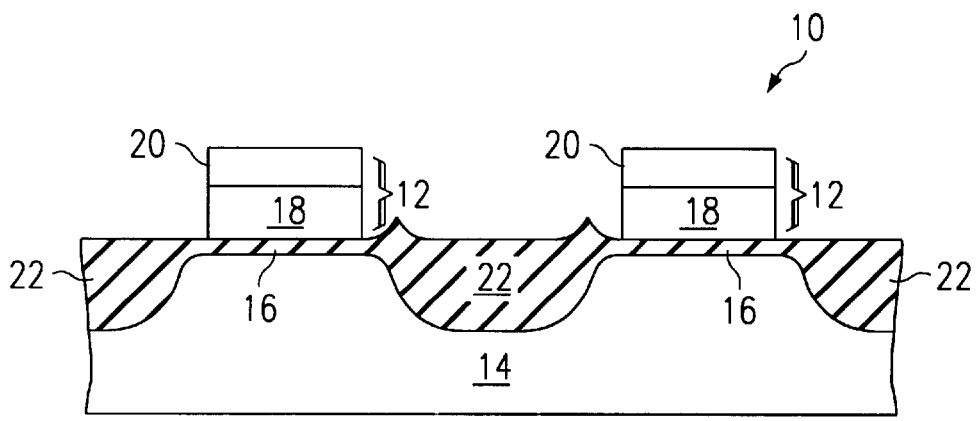
FIG. 1 is a cross-sectional view of a portion of a semiconductor device constructed in accordance with the present invention.

FIG. 1 is a cross-sectional view of a portion of a semiconductor device 10 constructed in accordance with the present invention. Semiconductor device 10 generally comprises a plurality of conductive gates 12 disposed outwardly from a silicon substrate 14, and separated from substrate 14 by a pad dielectric 16.

Pad dielectric 16 may comprise any suitable dielectric material, such as oxide. In this embodiment, silicon buffer structure 18 is not removed once it is formed. Rather, it becomes integrated as gate 12, or a part thereof. Pad dielectric 16, which resides inwardly from integrated buffer structure 18, is likewise integrated into the resulting semiconductor device. Accordingly, pad dielectric 16 may be advantageously formed by growing oxide outwardly from the surface of substrate 14 to form a good quality pad oxide. Although the illustrated embodiment shows the use of a grown good quality oxide, other dielectric materials that provide a good quality pad dielectric may be used without departing from the scope of the invention.

In the illustrated embodiment, each gate 12 comprises a silicon buffer structure 18 disposed outwardly from an associated pad dielectric 16. As will be described in detail below, silicon buffer structure 18 comprises a region of silicon that is used as a buffer layer during formation of device 10 through a technique analogous to poly-buffered local oxidation of silicon (PBL), or sidewall sealed poly-buffered local oxidation of silicon (SSPBL). Although the illustrated embodiment describes a process and resulting structure involving local oxidation of silicon, the invention is equally applicable to techniques involving shallow trench isolation. In some cases, it may be desirable in forming a semiconductor device using shallow trench isolation, to use a silicon buffer structure to protect the substrate in the active regions, and later reuse the silicon buffer structure as a conductive gate. The present invention may be practiced in methods involving local oxidation of silicon, or shallow trench isolation.

Traditionally, local oxidation of silicon techniques involve forming a polysilicon buffer layer outwardly from pad dielectric layer 16 to absorb stresses exerted by a protective dielectric cap during the formation of isolation dielectric regions between the active regions of the device. Unlike previous approaches, which typically discarded the polysilicon buffer layer after formation of these isolation regions, the present invention provides a method for retaining silicon buffer layer 18 for use as a conductive gate in a transistor, capacitor, or other semiconductor device. This provides an advantage of reducing fabrication time and expense by eliminating additional etching and formation steps used in previous approaches.

Silicon buffer structure 18 may comprise polysilicon or amorphous silicon. In the illustrated embodiment, silicon buffer structure 18 substantially comprises amorphous silicon. Using amorphous silicon as a buffer structure is advantageous in providing better stress shielding to the underlying silicon of substrate 14 than that provided by polysilicon. In addition, amorphous silicon withstands these stresses better than polysilicon, and is less likely to be damaged during the formation of isolation dielectric regions 22. As a result, the amorphous silicon of silicon buffer structure 18 provides an effective and reliable gate structure 12, or part thereof. In the illustrated embodiment, each gate 12 further comprises a conductive material 20 disposed outwardly from silicon buffer structure 18. Conductive material 20 may comprise any material suitable to provide an effective conductive gate structure 12. For example, conductive material 20 may comprise a film of tungsten, tungsten silicide, or any other suitably conductive material. In an alternative embodiment, silicon buffer structure 18 may comprise the entirety of gate 12. In that case, silicon buffer structure 18 may be made conductive by doping the structure; either by forming silicon buffer structure 18 from doped silicon, or by doping buffer structure 18 after its formation. Silicon buffer structure 18 may doped after its formation, for example using boron or phosphorous, as appropriate to the particular application. Alternatively, silicon buffer structure may be doped by out-diffusing a dopant from conductive layer 20 during a subsequent heating step.

Semiconductor device 10 provides a basic structure for the production of a variety of end-products. For example, semiconductor device 10 may be used in the formation of a transistor, wherein gate 12 resides between a source region and a drain region (not explicitly shown) of substrate 14. As a further example, semiconductor device 10 may be integrated into an array of capacitors in, for example, a dynamic random access memory structure. In that case, each gate 12 may serve as a first capacitor contact, which supports a capacitor dielectric region and a second capacitor contact. In yet another example, gate 12 of semiconductor device 10 may serve as a gate in a pass-gate transistor of a dynamic random access memory structure.

The present invention is not intended to be limited to a particular semiconductor device. Those skilled in the art will appreciate the applicability of the invention to various semiconductor devices that can be fabricated starting with the basic template shown in FIG. 1.

Figure 2A:
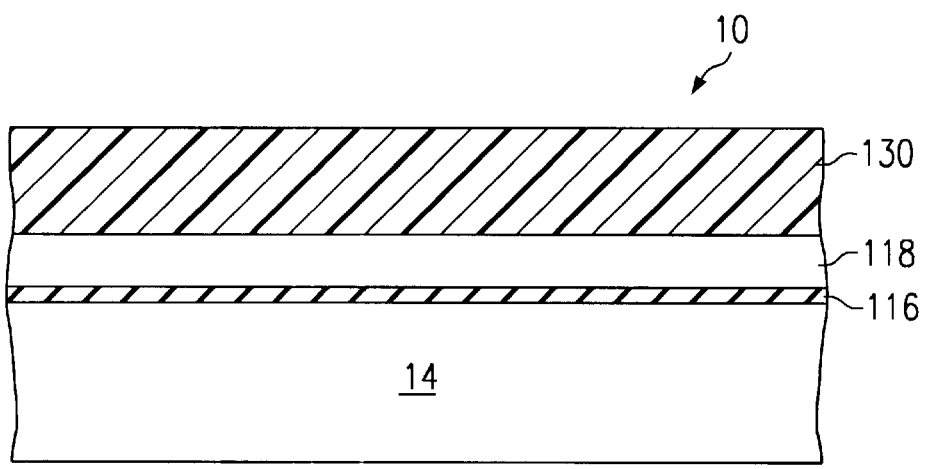
FIGS. 2a–2f are cross-sectional views showing an exemplary method of forming one embodiment of a semiconductor device according to the teachings of the present invention.

FIGS. 2a–2f are cross-sectional views showing an exemplary method of forming a portion of semiconductor device 10 according to the teachings of the present invention. FIG. 2a shows semiconductor device 10 after a pad dielectric layer 116, a silicon buffer layer 118 and a first protective dielectric layer 130 have been disposed outwardly from semiconductor substrate 14. In this embodiment, pad dielectric layer 116 comprises a pad oxide layer formed by growing a good quality layer of oxide outwardly from substrate 14. Pad dielectric layer 116 may comprise, for example, approximately 30–200 angstroms of good quality pad oxide. Particular dimensions specified throughout this document are intended for exemplary purposes only, and are not intended to limit the scope of the invention.

At some point, the active regions of device 10 corresponding to regions of substrate 14 disposed inwardly from gates 12, may be doped to adjust the threshold voltage $V_t$ of device 10. This doping may comprise, for example, a low energy ion implantation through pad dielectric layer 116. Since pad dielectric layer 116 is relatively thin, and the energy of implantation is low, damage to the dielectric is minimal. In another embodiment (not explicitly shown), a sacrificial dielectric layer may be disposed prior to formation of pad dielectric layer 116. In that case, the active regions of device 10 are doped by implantation through the sacrificial dielectric layer. Then, the sacrificial dielectric layer is removed, and pad dielectric layer 116 is formed. If this option is used, a suitable marking technique can be implemented for demarcation of the active regions to aid in subsequent location and formation of gate structures 12.

Silicon buffer layer 118 may comprise, for example, amorphous silicon or polysilicon. In this embodiment, silicon buffer layer 118 comprises approximately 100–500 angstroms of substantially amorphous silicon. Silicon buffer structures 18 will subsequently be formed from silicon buffer layer 118. Each silicon buffer structure 18 acts to shield an active region of substrate 14 to prevent stress induced dislocations due to stresses exerted by protective dielectric cap 30 during the formation of isolation dielectric regions 22. Forming silicon buffer structures 18 from amorphous silicon provides an advantage of increasing the shielding effect to substrate 14. In addition, amorphous silicon is more resistant to stress than polysilicon. Integrating a substantially amorphous silicon buffer structure 18 into gate 12 results in a more effective and reliable gate structure.

First protective dielectric layer 130 may comprise any appropriate dielectric material, or combination of dielectric materials suitable to shield underlying structures from subsequent oxidations. For example, first protective dielectric layer 130 may comprise a nitride compound, silicon nitride, nitridated silicon oxide, tantalum pentoxide, barium strontium titanate, or combinations of these, or other suitable dielectrics. In the illustrated embodiment, first protective dielectric layer 130 comprises approximately 200–2,000 angstroms of silicon nitride.

Figure 2B:
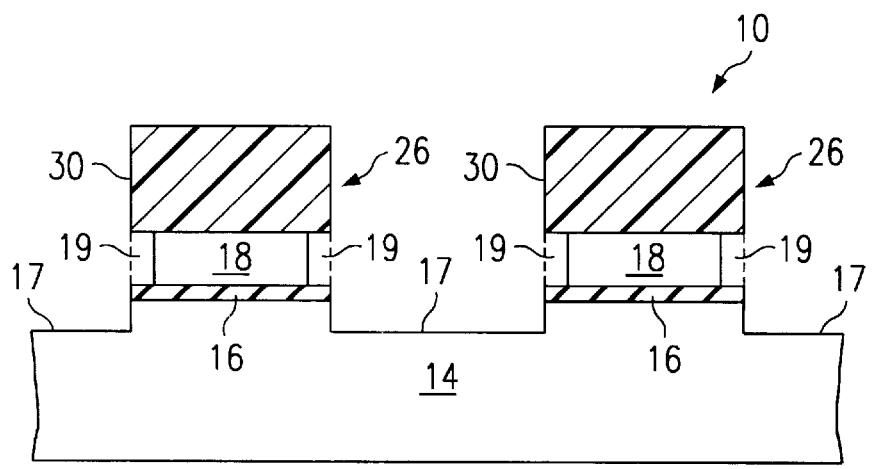

FIG. 2b shows semiconductor device 10 after a plurality of moat stacks 26 have been formed outwardly from substrate 14 and trenches 17 have been formed in substrate 14 between moat stacks 26. Moat stacks 26 and trenches 17 may be formed, for example, by patterning and etching layers 116, 118, and 130, and substrate 14 using a photoresist mask. In this embodiment, trenches 17 are formed between moat stacks 26 to aid in creating a semiconductor device having a planar surface. Trenches 17 compensate for any outward growth of isolation dielectric regions 22, and thereby assist in providing a planar resulting structure. The present invention may also be practiced without forming trenches 17 between moat stacks 26.

During the pattern and etch used to form moat stacks 26, side wall regions 19 of silicon buffer structures 18 may be removed so that a recessed area results from the removed side wall regions 19, which undercuts an adjacent region of protective dielectric cap 30. In other words, protective dielectric cap 30 overhangs sidewall regions 19 of silicon buffer structure. Removal of sidewall regions 19 of silicon buffer structure 18 may be affected through any appropriate process. For example, side wall regions 19 may be removed using an isotropic etch directed at these regions to laterally etch recesses at sidewall regions 19 of silicon buffer structures 18. As another example, sidewall regions 19 may be removed during the etch that forms moat stacks 26, using an etchant that naturally tends to laterally etch sidewall regions 19 silicon buffer structures 18. As still another example, sidewall regions 19 may be removed during the etch that forms moat stacks 26, by overetching for a period of time to cause the etchant to laterally etch silicon buffer structure 18 because there is no other silicon left to etch.

Laterally etching silicon buffer structures 18 to undercut protective dielectric caps 30 provides an advantage of eliminating regions available to transmit stress from protective dielectric cap 30 to substrate 14. In addition, the recesses formed through the undercutting process create convenient anchor points for protective sidewall structures 28.

Figure 2C:
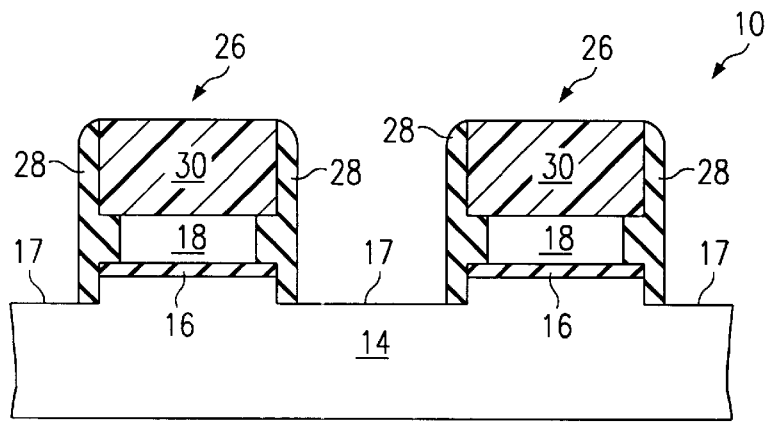

FIG. 2c shows a cross-sectional view of semiconductor device 10 after formation of side wall protective structures 28. After the silicon has been removed from side wall regions 19 of silicon buffer structure 18, a second protective dielectric layer (not explicitly shown) may be formed outwardly from the sidewalls of moat stacks 26. In this embodiment, a second protective dielectric layer is formed outwardly from the sidewalls of moat stacks 26 and outwardly from pad dielectric 116. The second protective dielectric layer may comprise, for example, a nitride compound, silicon nitride, nitridated silicon oxide, tantalum pentoxide, barium strontium titanate, or any other suitable dielectric material or heterostructures of dielectric materials. In this embodiment, the second protective dielectric layer is formed using low pressure chemical vapor deposition of silicon nitride to form an approximately 200–1,000 angstrom thick protective layer. Other suitable techniques may be used without departing from the scope of the invention. For example, in an alternative embodiment (not explicitly shown), the sidewalls of silicon buffer structures 18 (and substrate 14 if the etch creating moat stacks 26 extended that far) may be oxidized to form a layer of oxide outward from the exposed sidewall regions of silicon.

After forming the second protective dielectric layer, an isotropic etch may be performed to remove regions of the second protective dielectric layer from between and on top of moat stacks 26, leaving sidewall protective structures 28 disposed adjacent to the sidewalls of moat stacks 26 and trenches 17. In the illustrated embodiment, recessed sidewall regions 19 of silicon buffer structure 18 provide effective anchor points to secure the position of sidewall protective structures 28. Sidewall protective structures 28 and trenches 17 help to prevent formation of non planarized surfaces during the growth of isolation dielectric regions 22 between moat stacks 26.

Figure 2D:
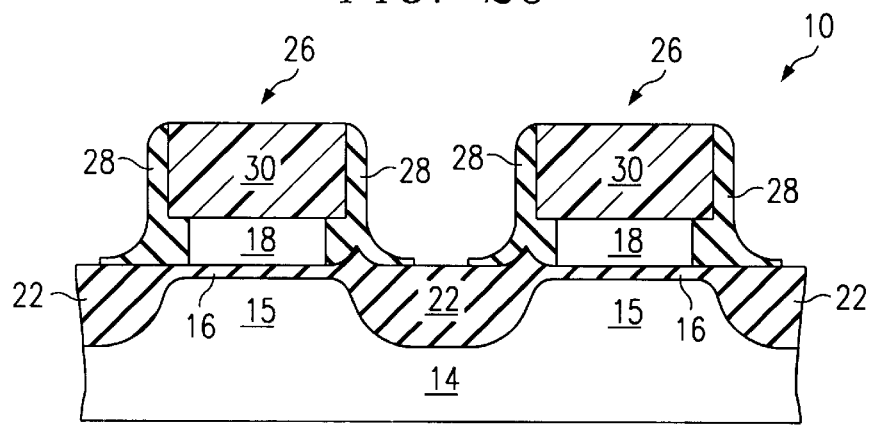

FIG. 2d is a cross-sectional view of a portion of semiconductor device 10 after isolation dielectric regions 22 have been formed between moat stacks 26. In the illustrated embodiment, isolation dielectric regions 22 are formed by thermally growing, for example by steam oxidation, field oxide in regions between moat stacks 26. Channel-stop implant with boron or other suitable dopants can be performed either prior to or after the field oxidation, to provide better electrical isolation between active devices.

The thermal growth of isolation dielectric regions 22 may cause stress on the silicon of substrate 14 surrounding each isolation region 22. Silicon buffer structures 18 effectively shield the silicon within the active regions of substrate 14, absorbing the stress and preventing dislocations which could otherwise lead to leakage current in device 10.

Figure 2E:
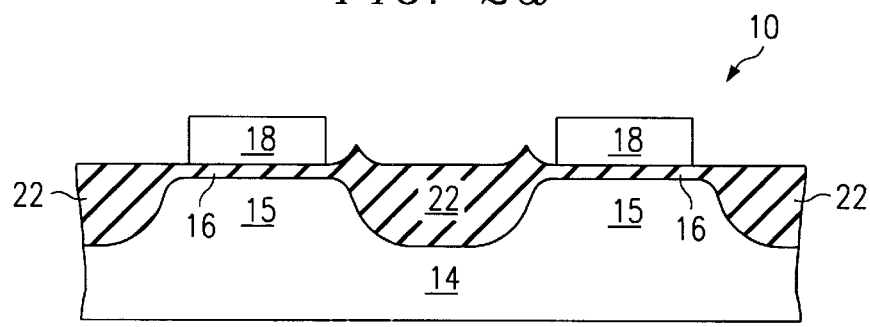

FIG. 2e shows a cross-sectional view of a portion of semiconductor device 10 after removal of protective side wall structures 28 and protective dielectric caps 30. Protective dielectric caps 30 and protective side wall structures 28 may be removed, for example, using hot phosphoric acid to expose silicon buffer structure 18.

Figure 2F:
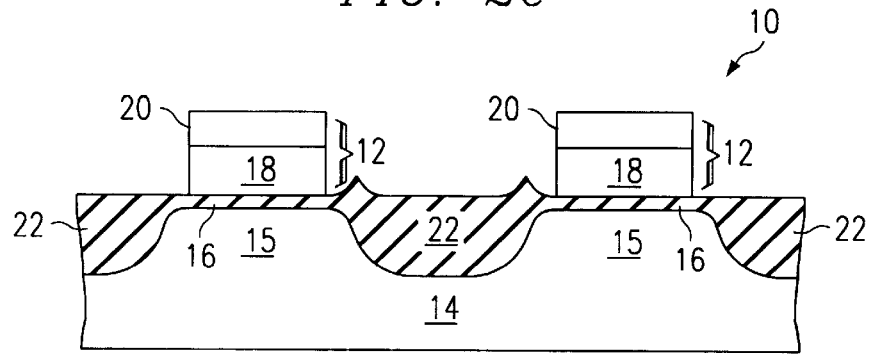

FIG. 2f is a cross-sectional view showing semiconductor device 10 after formation of conductive gates 12 disposed outwardly from active regions 15. In the illustrated embodiment, each gate structure 12 substantially comprises an amorphous silicon buffer structure 18 and a film of conductive material 20 disposed outwardly therefrom. Conductive material 20 may comprise, for example, any material suitable to provide a conductive gate structure 12 such as tungsten or tungsten silicide.

Although the present embodiment shows a single layer of conductive material 20, any suitable number of layers may be used without departing from the scope of the invention. In addition, although the illustrated embodiment shows formation of conductive material layer 20 after formation of isolation dielectric regions 22 and removal of protective dielectric cap 30, conductive material layer 20 may also be formed prior to formation of protective dielectric cap 30. In that case, conductive material layer 20 may be laterally etched in a manner similar to that described with respect to silicon buffer layer 18. Conductive material layer 20 may be laterally etched along with silicon buffer structure 18, or may itself be undercut by a lateral etch of silicon buffer structure 18. In another embodiment, silicon buffer structure may remain intact, while sidewall regions of conductive material layer 20 are laterally etched to undercut protective dielectric cap 30.

In another embodiment, rather than forming a separate conductive layer outwardly from silicon buffer structure 18, silicon buffer structure 18 may comprise the entirety of conductive gate 12. In that case, silicon buffer structure 18 may be made conductive through doping with a suitable dopant, either by forming silicon buffer structure from doped silicon, or by doping silicon buffer structure after it has been formed, for example from intrinsic silicon.

The present invention provides an advantage of reduced fabrication time by utilizing existing silicon buffer structure 18 as a conductive gate, rather than necessitating the extra steps of removing silicon buffer structure 18 and pad dielectric 16, and reforming new pad dielectric layers and gate structures.

Although the present invention has been described in detail it should be understood that various changes and substitutions may be made hereto without departing from the scope of the present invention as defined by the appended claims. For example, although the illustrated embodiment has been described with reference to a side wall sealed silicon buffered local oxidation of silicon technique, it should be appreciated that the present invention may apply equally to a technique that eliminates the use of side wall protective structures. For example, the invention may apply to a fabrication technique implementing silicon-buffered local oxidation of silicon, which uses a substantially amorphous silicon buffer structure. Furthermore, although the present invention has been described with reference to a local oxidation of oxide technique, the invention is equally applicable to a process involving shallow trench isolation, where it may be desirable to use a silicon buffer layer to protect the substrate, and reuse the silicon buffer layer as a conductive structure after the formation of the isolation dielectric regions between the active regions.

What is claimed is:

1. A method of forming a semiconductor device, comprising:

forming a moat stack outwardly from a substrate, the moat stack comprising a dielectric pad disposed outwardly from in contact with the substrate, a silicon buffer structure disposed outwardly from in contact with the dielectric pad, and a protective dielectric cap disposed outwardly from the silicon buffer structure;

forming a protective sidewall structure outwardly from at least a sidewall of the silicon buffer structure;

forming an isolation dielectric region adjacent to the moat stack;

after formation of the isolation dielectric region, removing the protective dielectric cap; and forming a conductive gate comprising the silicon buffer structure.

2. The method of claim 1, wherein the silicon buffer structure substantially comprises amorphous silicon.

3. The method of claim 1, wherein forming the moat stack comprises:

forming a pad dielectric layer outwardly from the substrate;

forming a silicon buffer layer outwardly from the pad dielectric layer;

forming a first protective dielectric layer outwardly from the silicon buffer layer;

removing regions of the first protective dielectric layer and the silicon buffer layer adjacent to the moat stack, the remaining portions of those layers comprising the protective dielectric caps and silicon buffer structures, respectively; and removing at least a portion of the sidewall region of the silicon buffer structure, the sidewall region of the silicon buffer structure disposed inwardly from a sidewall region of the protective dielectric cap, wherein the removed sidewall region of the silicon buffer structure undercuts the sidewall region of the protective dielectric cap.

4. The method of claim 3, further comprising:

forming a conductive layer outwardly from the silicon buffer structure; and removing at least a portion of a sidewall region of the conductive layer, the sidewall region of the conductive layer disposed inwardly from the sidewall region of the protective dielectric cap, wherein the removed sidewall region of the conductive layer undercuts the sidewall region of the protective dielectric cap.

5. The method of claim 3, wherein forming the protective sidewall structure comprises forming the protective sidewall structure outwardly from at least the removed sidewall region of the silicon buffer structure, the removed sidewall region of the silicon buffer structure providing an anchor point for the protective sidewall structure.

6. The method of claim 1, wherein forming the moat stack comprises:

forming a pad dielectric layer outwardly from the substrate;

forming a silicon buffer layer outwardly from the pad dielectric layer;

forming a first protective dielectric layer outwardly from the silicon buffer layer;

removing regions of the first protective dielectric layer and the silicon buffer layer adjacent to the moat stack, the remaining portions of those layers comprising the protective dielectric caps and the silicon buffer structures, respectively;

forming a conductive layer outwardly from the silicon buffer structure; and removing at least a portion of a sidewall region of the conductive layer, the sidewall region of the conductive layer disposed inwardly from the sidewall region of the protective dielectric cap, wherein the removed sidewall region of the conductive layer undercuts the sidewall region of the protective dielectric cap.

7. The method of claim 1, wherein forming a conductive gate comprises doping the silicon buffer structure.

8. The method of claim 7, wherein doping the silicon buffer structure comprises forming the silicon buffer structure from doped silicon.

9. The method of claim 1, wherein forming a conductive gate comprises forming a conductive layer outwardly from the silicon buffer structure, the combination of the silicon buffer structure and the conductive layer comprising the conductive gate.

10. The method of claim 9, further comprising outdiffusing a dopant from the conductive layer into the silicon buffer structure.

11. A method of manufacturing a semiconductor device, comprising:

forming a moat stack outwardly from a substrate, the moat stack comprising a dielectric pad disposed outwardly from the substrate, a substantially amorphous silicon buffer structure disposed outwardly from the dielectric pad, and a protective dielectric cap disposed outwardly from the substantially amorphous silicon buffer structure;

forming an isolation dielectric region adjacent to the moat stack;

after formation of the isolation dielectric region, removing the protective dielectric cap; and forming a conductive gate comprising the substantially amorphous silicon buffer structure.

12. The method of claim 11, wherein forming the moat stack comprises:

forming a pad dielectric layer outwardly from the substrate;

forming a substantially amorphous silicon buffer layer outwardly from the pad dielectric layer;

forming a first protective dielectric layer outwardly from the silicon buffer layer;

removing regions of the first protective dielectric layer and the silicon buffer layer adjacent to the moat stack, the remaining portions of those layers comprising the protective dielectric caps and silicon buffer structures, respectively; and removing at least a portion of the sidewall region of the silicon buffer structure, the sidewall region of the silicon buffer structure disposed inwardly from a sidewall region of the protective dielectric cap, wherein the removed sidewall region of the silicon buffer structure undercuts the sidewall region of the protective dielectric cap.

13. The method of claim 11, wherein forming a conductive gate comprises doping the substantially amorphous silicon buffer structure.

14. The method of claim 11, wherein forming a conductive gate comprises forming a conductive layer outwardly from the substantially amorphous silicon buffer structure, the combination of the substantially amorphous silicon buffer structure and the conductive layer comprising the conductive gate.

* * * * *